United States Patent [19]

Prokopp

[11] Patent Number: 4,926,119
[45] Date of Patent: May 15, 1990

[54] CONTACT DEVICE FOR THE TESTING OF PRINTED CIRCUIT BOARDS OR THE LIKE

[76] Inventor: Manfred Prokopp, Am Felder 27, D-6980 Wertheim-Reicholzheim, Fed. Rep. of Germany

[21] Appl. No.: 319,436

[22] Filed: Mar. 3, 1989

[30] Foreign Application Priority Data

Mar. 4, 1988 [DE] Fed. Rep. of Germany ....... 3807024
Mar. 4, 1988 [DE] Fed. Rep. of Germany ... 8802890[U]
Apr. 29, 1988 [DE] Fed. Rep. of Germany ....... 3814620

[51] Int. Cl.$^5$ .............................................. G01R 1/06
[52] U.S. Cl. ............................... 324/158 P; 324/158 F
[58] Field of Search ........... 324/158 F, 158 P, 73 PC; 439/55

[56] References Cited

U.S. PATENT DOCUMENTS 4,357,062 11/1982 Everett ........................... 324/73 PC
4,535,536 8/1985 Wyss ................................. 324/73 PC
4,721,908 1/1988 Driller et al. ..................... 324/158 F Primary Examiner—Reinhard J. Eisenzopf
Assistant Examiner—Vinh P. Nguyen
Attorney, Agent, or Firm—Herbert Dubno

[57] ABSTRACT

A contact device for evaluating electrical or electronic test articles has a plate arrangement having a plurality of parallel plates in which contact needles are inserted with slide-bearing play. Each contact needle is juxtaposed with a spring-loaded electrically conductive countercontact element. The contact needles are each constituted of a straight pin and a tubular sleeve projecting beyond the rear end of the pin and affixed thereto. A rear plate can serve as an abutment for the sleeves and the countercontact elements have tapered ends engaging in the hollows formed by the respective sleeves and electrically contacts the sleeves at the inner edges of the open ends of these sleeves.

18 Claims, 2 Drawing Sheets

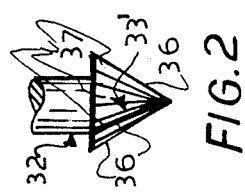
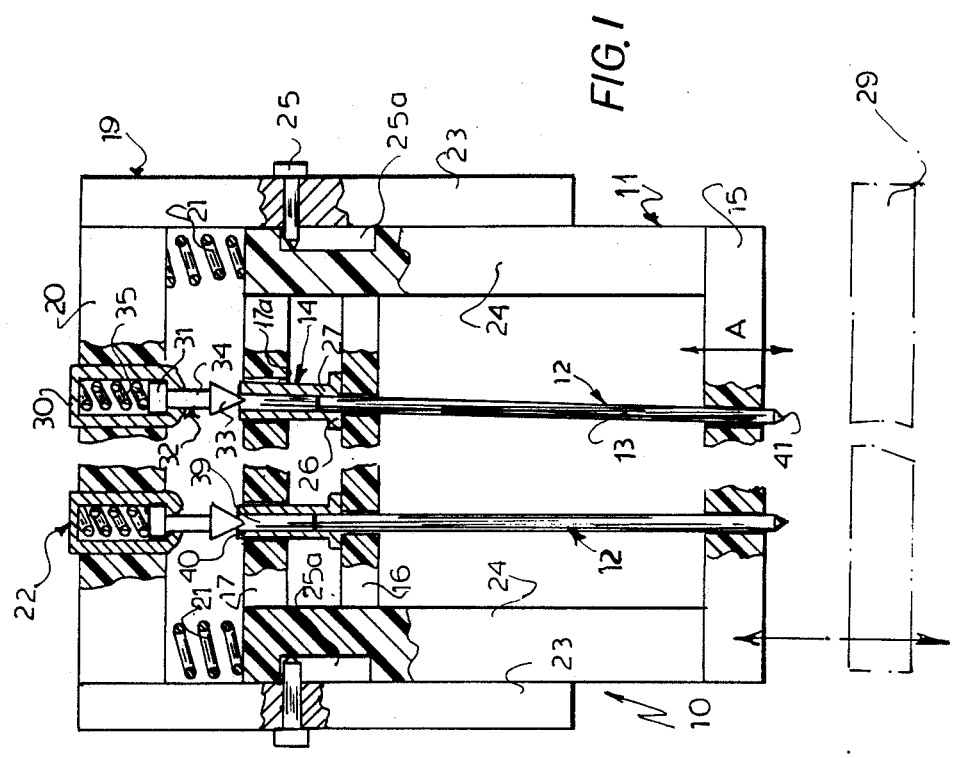

CONTACT DEVICE FOR THE TESTING OF PRINTED CIRCUIT BOARDS OR THE LIKE

CROSS REFERENCE TO RELATED APPLICATION

This application is related to my copending U.S. patent application Ser. No. 07/300,957 filed 23 Jan. 1989 (copending).

FIELD OF THE INVENTION

My present invention relates to a contact device for a testing unit for the electrical or electronic testing of electrical or electronic articles such as printed circuit boards or the like.

More particularly, the invention relates to a contact device for such purposes which comprise a plate assembly carrying a multiplicity of contact needles which are movable in the plate assembly and have tips which can be pressed against various locations on the printed circuit board or other article to be tested and which cooperate with countercontact elements so that an electrical connection is made between each countercontact element and an end of the respective needle remote from the tip which engages the article to be tested.

BACKGROUND OF THE INVENTION

A known contact device of this type is described in European patent publication EP-A-02 15146. In this system, the contact needles at their front ends, i.e. the ends which are to contact the test article, are guided in bores of a front plate of the plate assembly. The bores of the front plate are distributed in accordance with the test points on the article at which the contact needles are to engage the latter.

The contact needles, in the region of their rear ends, are held by an elastic plate through which the needles pass so that the needles cannot fall out of the test adapter.

At their rear ends, which are formed with a frustoconical configuration, these needles engage in conical bores of the heads of the spring-loaded countercontact elements to establish electrical connection therewith.

The frustoconical rearwardly converging tips of the contact needles are affected by dirt and other contaminants, such as abrasion products and wear products of the contact device between the frustoconical tips and the frustoconical sockets of the countercontact elements, which contaminants pass between the two members which are to make electrical contact. In practice, this is observable as a sharp increase in the electrical resistance of the conductive path between the countercontact element and the contact needle or even in interruption in the electrical continuity therebetween.

This type of connection between this contact needle and the countercontact element having respectively a frustoconical rearward tip and a conical bore receiving the tip cannot prevent sudden and unpredictable contamination and thus uncontrolled electrical resistances or unexpected electrical path interruptions from developing.

While uncontrolled increases in electrical resistance can result in improper readings and measurements which may signal faults in the test article where none may exist, interruptions in continuity can render the entire test device unusable.

It has also been found that the retention of the contact needles in an elastic plate with extremely small pitch rasters, i.e. with a spacing between nearest neighbors of the needles of say 1/10th of an inch or often substantially less contributes the possibility of problems since the elastic plate does not permit independent resilient displacement of each needle. By and large it is found that with such elastic means practically a constant displacement is necessary for all needles to ensure effective resilient support for the needles. In practice, however, the contact needles may have to engage points of different heights on the test article so that there are differences in the resilient or spring force applied to the contact needles.

OBJECTS OF THE INVENTION

It is, therefore, the principal object of the present invention to provide an improved contact device for the purposes described whereby the drawbacks of the earlier system can be obviated.

Another object of this invention is to provide an improved contact device which allows individual resilient bias of each contact needle while nevertheless guiding the needles in a plate assembly and allowing the needles to traverse bores of the front plate of that assembly which are distributed in accordance with the layout of the contact points on the test article to be engaged.

SUMMARY OF THE INVENTION

These objects and others which will become apparent hereinafter are attained, in accordance with the invention, with a contact device for electrical or electronic testing of a test article, the device comprising:

a holder;

an array of electrically conductive countercontact elements on the holder, each of the countercontact elements including a tapering contact head biased by a spring force in a direction of taper of each head;

a plate assembly comprising at least two mutually parallel transversely spaced plates including a rear plate located proximal to the holder and a front plate located remote from the holder and juxtaposable with a test article, the plates being formed with arrays of throughgoing bores;

a plurality of contact needles received in the plate assembly, each of the needles passing slidable through one of the bores of each plate and having a front end formed as a contact tip for contacting the article and a rear end engageable by a respective one of the heads, each of contact needles being constituted as a straight pin traversing a respective bore of the front plate and a tubular sleeve receiving an end of the respective pin at the rear end of the respective needle, each sleeve projecting beyond the respective pin and having a hollow opening at an end of the respective sleeve at a contact edge and receiving the respective head, whereby a taper of each head engages the respective contact edge to form an electrical connection between each head and the respective rear end of a respective contact needle, the contact needles being received in the respective bores of the plates so as to enable axial movement of the contact needles in the plates against the spring forces of the respective contact heads.

Advantageously, each of the sleeves is formed with or constitutes an abutment engageable with the rear plate.

Each of the sleeves can be formed with an annular flange at an end of the respective sleeve turned toward the respective tip and engageable with a surface of the rear plate turned toward the holder, the assembly further comprising another rear plate spaced from the first-mentioned rear plate and interposed between the first-mentioned rear plate and the support, the other rear plate being formed with bores respectively slidably traversed by the rear ends of the contact needles, the flanges being located between the rear plates and being abuttingly engageable with the other rear plate.

Alternatively, each of the sleeves can have an end forming the respective abutment and engageable with a surface of the rear plate turned toward the holder.

The invention also includes a method of inserting needles into such a device which comprises the steps of:

(a) positioning the rear plate above the front plate while enabling relative displacement of the plates;

(b) relatively displacing the plates to position a selected bore of the front plate directly below a selected bore of the rear plate;

(c) dropping a respective needle through the bores from above;

(d) repeating steps (b) and (c) in succession of all of the needles required to engage and test the article; and (e) fixing the plates against relative displacement, whereby at least some of the bores of the front plate are offset from locations directly below the corresponding bores of the rear plate and the respective contact needles are thereby inclined to the axes of respective bores of the rear plate.

With this contact device, each needle is axially displaceable independently from the remaining contact needle. Each needle thus can have the full force applied thereto which is generated by bringing the test device together with the test article since that force is transferred to each needle via its tubular sleeve by the respective countercontact element. This ensures a reliable contact at all of the test points of the article to be contacted.

It is especially advantageous, moreover, that the conical heads of the countercontact elements penetrate into the cylindrical hollows of the sleeves and engage the latter at edges formed by the inner surface of the hollow at the open end of the sleeve. This ensures reliable electric current between the countercontact element head and the needle even when the contact needle is not precisely aligned with the countercontact element but rather may be slightly inclined to the latter.

This can be the case when, as is another feature of the invention, the bores of the front plate depart from the raster pattern of the bores of the rear plate or the bores of the front plate are offset from a direct vertical line through the bores of the rear plate.

This arrangement of the front plate allows the locations of contact of the needles with the test article to be varied from test article to test article and, in that case, at least the respective front plates can be interchangeable.

With the arrangement of the invention, moreover, and the engagement of the edge of a sleeve with the contact head of the countercontact element, practically the entire free cross section of the interior of the sleeve, i.e. the hollow of the sleeve, can be covered so that no contaminants can accumulate in these hollows or contaminants can scarcely enter the hollows.

Furthermore, the hollows can be comparatively large since the contact pin may terminate well inwardly from the open end of the sleeve or, stated otherwise, each sleeve can project to a substantial extent beyond the end of the respective contact pin. As a result, each hollow has a large volume and can accommodate relatively large amounts of dirt or other contaminants without deterioration of the electrical contact between the head of the countercontact element and the respective inner edge of the sleeve.

The sensitivity of the device to contamination is also reduced in accordance with the invention since the sleeves are open only upwardly and contaminants resulting from rubbing of the contact needles in the plate assembly cannot readily enter the hollows because the sleeves are closed on their sides turned toward the wear locations.

Such abraded materials generally derive from the insulating plates and are themselves insulated, but do not play a significant roll in restricting electrical conduction between the countercontact electrodes and the contact needles.

According to the invention, therefore, I am able to increase the operating life of the contact device by preventing the products of wear from increasing the electrical contact resistance between the contact needles and the countercontact elements even with long operating periods and a great many operating cycles. Electrical interruption does not result and hence the operating cost is greatly reduced.

Another advantage of the device of the invention is that the force applied by the countercontact elements can be delivered by the contact needles to the contact locations on the test article practically without attenuation so that particularly reliable contacts are made with the test article.

The contact device, which can also be referred to as a test adapter, is so formed, moreover, that it can be used in a variety of positions without the danger that the needles will fall out.

This can be achieved simply and economically by the arrangement of the sleeve at the rear end of the pin and the formation of the countercontact element with its head as described, spring loaded in a respective bore of a plate of the holder.

The invention provides a simple technique for inserting contact needles in the bores of the plates of the plate assembly when, as is generally the case, not all the bores of the front plate correspond to the raster points of a predetermined raster as do the bores of the rear plate or the bores of at least one of the rear plates of the plate assembly.

In this case, the front plate and rear plate are moved relative to one another, e.g. by moving the front plate parallel to its plane, until a selected bore of the front plate is lined up directly below a respective bore of the rear plate and a needle is inserted through the aligned bores.

This process is repeated for all the bores of the front plate which are to receive the needles and thereafter the front and rear plates are fixed together with the bores of the front plate being out of direct alignment along vertical or lines along the axes of the bores of the rear plates. Inclinations of up to 6° with respect to the axis of the respective bore of the rear plate can be accommodated.

BRIEF DESCRIPTION OF THE DRAWING

The above and other objects, features and advantages of the present invention will become more readily apparent from the following description, reference being made to the accompanying drawing in which:

FIG. 1 is a side elevational view, partly broken away and partly in section, of a contact device according to the present invention;

FIG. 2 is a detail view drawn to a larger scale than FIG. 1 of a variant of a head of a countercontact element of the device;

SPECIFIC DESCRIPTION

Figure 4:
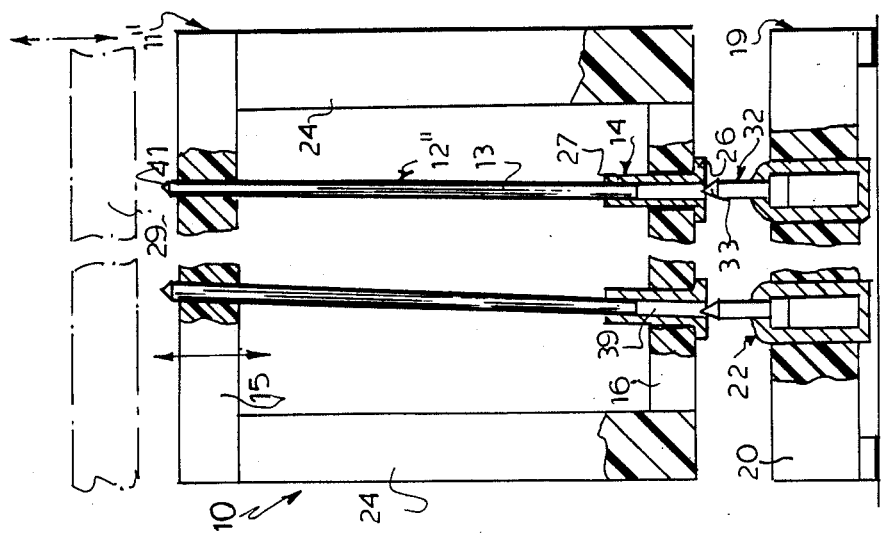
FIG. 4 is a view similar to FIG. 3 of yet another embodiment of the invention.

The contact device shown in FIG. 1 at 10 is used for the testing of circuit objects or articles such that the contact needles of the device of the invention can press against predetermined locations on the article to be tested and readings of resistance, conductivity or the like can be taken. Voltage measurements may be made and like test programs can be executed. The articles, not shown in detail but represented generally at 19, can include printed circuit boards, integrated circuits, chips or the like and generally the test operation will be associated with testing for electrical circuit faults.

The contact device 10 comprises a plate arrangement generally represented at 11 in which an array of metallic contact needles 12 can be mounted for engagement with the article under test. While a single linear array of such needles may be used, more generally the array of needles comprises a plurality of rows of equispaced needles and the rows can be spaced apart with spacings corresponding to the needle spacing so that the needles are located in a raster pattern. Each contact needle 12 comprises a relatively massive straight pin 13 having a diameter of, for example, 0.1 to 1.4 mm at a rear end of which is fixed coaxially with the pin 13, a flanged sleeve 14.

The flanged sleeve 14 has its flanged end turned toward the contact tip of the pin 13 and is open in a direction away from the contact tip.

In the embodiment shown in FIG. 1, each contact needle 12 is guided in aligned bores of three mutually parallel but transversely spaced plates 15, 16 and 17 of the plate arrangement 11. Within the plates, the contact pins with their flanged sleeves are axially movable and retained against falling out by the flanges 26 of the sleeves 14 which are located between the plates 16 and 17 as is readily apparent from FIG. 1.

The contact device 10 further comprises a fixed rigid holder device 19 which is formed with a rigid plate 20 serving as a support for metallic countercontact elements 22. The plates 15-17 and 22 are all composed of electrically insulating material such as a synthetic resin.

The plate arrangement 11 is movable vertically relative to the holder 19, i.e. in a direction perpendicular to the plates while the contact needles 12 extend perpendicular to the plane of the plate 20.

The displacement of the plate arrangement 11 relative to the holder 19 can be effected against the force of a multiplicity of restoring springs 21 of which two can be seen in FIG. 1.

The plate arrangement 12 can carry a very large number of contact needles represented by the two which have been shown in FIG. 1. Each of the contact needles, of course, is provided with a respective one of the countercontact elements 22 previously mentioned. The holder 19 has guide rolls 23 for linear guidance of the plate arrangement 11. Only two of these guide rolls 23 are visible in the drawing, although the number of such guide rails should be sufficient to prevent canting and binding of the plate arrangement 11.

Similarly, the plates 15-17 of the plate arrangement can be held together by lateral beams or longitudinal beams 124 forming sides of the plate assembly and flanking the array of pins.

As a consequence, the plate arrangement 11 is linearly displaceable in the direction of the double-headed arrow A and is held against twisting, rotation or canting.

The relative movement of the plate arrangement 11 with respect to the folder 19 can be limited by pins 25 of the rails 23 which engage in grooves 25a of members 24, these grooves extending in the direction of the double-headed arrow A. The plate 17 closest to the countercontact elements 22 and fixed to the beams 24 are formed with bores 17a through which the circularly cylindrical hollow shanks 27 of the flanged sleeves 14 can extend even when there is a slight inclination of the contact needles of, for example, a maximum of 8° to the direction of movement, so that these contact needles can pass with axial mobility through the bores. In other words, the bores 17a guide the contact needles at their shanks 27 but provide sufficient play to allow a tilted orientation of the needles by up to 6°.

This rearward play 17 can be releasably connected to the mutually parallel beams 24, e.g. by screws (not shown). The front plate 15 of the plate arrangement 11 can likewise be releasably mounted on the two beams 24. As noted, the flat plates 15-17 of the plate arrangement 11 are composed of electrically insulating synthetic resin and their planes lie perpendicularly to the direction of displacement A of the plate arrangement.

In many cases it can be advantageous and is within the scope of the invention to make the front plate 15 resiliently yieldable or linearly movable against a resilient force on the beams 24 to provide a shock-absorbing attenuator upon contact of the device with a test article 29.

Within the cylindrical and preferably circularly cylindrical throughgoing passage of each flanged sleeve, i.e. in the interior of each flanged sleeve 14, the pin 13 extends only to substantially a third of the length of this interior space and is rigidly connected with the sleeve by a press-fit or other form-fitting and force-fitting junction.

Fastening can be effected by providing a step on the sleeve or on the pin and/or by soldering or, most preferably, by welding usually with a laser spot-weld.

Since the sleeve will then extend, for example, by 1 to 3 mm beyond the end of the pin 13, the interior of the sleeve forms a cylindrical and preferably circular cylindrical hollow space 39 which is open at the rearwardly turned end of the flanged sleeve 14. This opening is defined by the inner edge 40 of the inner wall of the tubular shaft 27.

While it is true that in the hollows 39 of the contact pins dirt or other contaminants can accumulate, such accumulations will not affect the electrical contact formed between each inner edge 40 and the head 33 of the respective countercontact element 22, especially where the head 33 is a conical head so that sharp-edged line contact is effected between the edge 40 and the conical surface of the countercontact element.

Since the hollows 39 are only open toward the countercontact element and not into the plate arrangement, no significant wear of the synthetic resin plates by contaminants which pass from the hollows 29 to the plate arrangement can occur.

Finally in this respect, it can be noted that the hollows 39 are practically sealed by the heads 33 so that actual accumulation of contaminants is at a minimum. As a consequence, it is with the greatest of reliability that the electrical contact resistance between each sleeve 14 and the respective head 33 will not increase even over long operating periods.

Each pin 13 is, with the exception of its front conical pointed end or tip 41, circularly cylindrical and straight and is axially rigid in all phases of operation of the device.

The contact needles 12, therefore, can be treated as rigid contact needs with respect to the conditions under which the device operates although it is self-understood that when the needles are outside the device of the invention, they are elastically bent from their straight normal orientations. The contact needles can be composed, for example, of high alloy steel or other wear-resistant materials and can be coated, if desired, in whole or in part with noble metals such as metals of the platinum group, gold or silver.

The individual countercontact elements 22 are formed in accordance with the present invention as spring contact pins, and each can comprise a metallic sleeve 30 which is rigidly fixed in the plate 20 of the holder.

A piston 31 is slidable in the sleeve 30 and is coaxial therewith.

The piston 31 forms part of the countercontact pin represented generally at 32 and can be formed with a shaft 34 in one piece with the conical head 33 previously described and the piston 31. Alternatively, the head 33 can be fixed on the shaft 34.

The head 33, in the embodiment shown in FIG. 1, has as its rearward end a diameter greater than that of the shaft 34. In many cases the head, however, can be formed as a convergent or tapered end of the shaft 34 itself.

Furthermore, in the embodiment illustrated in FIG. 1, the diameter of the head 33 at its rearward end is greater than the diameter of the inner edge 40 of the sleeve 41.

The head 33 is tapered, in the embodiment of FIG. 1, from its region of greatest diameter conically in the direction of the flanged sleeve 14 of the respective contact needle 12.

The conical surface of the head 33 contacts the inner edge 40 of the respective end of the wall of the flanged sleeve with a force generated by a prestressed metallic compression spring 25 received in the sleeve 30 of the respective countercontact element 22 bearing on the piston 31. Thus the hollow 39 is continuously blocked and, for the most part, no contaminants can enter the hollow.

Of course, the countercontact element 22 can alternatively be so arranged that, in the illustrated position of the respective contact needle 12, the head 33 of the contact body 32 can be at a spacing from the respective flanged sleeve 14 and only come into contact with the flanged sleeve when the needle array is brought into contact with the test article 29.

The contact device 10 can also be so provided that the contact needle tips 41 are upwardly directed (see FIG. 4) and the heads 33 somewhat set back so that, in the rest position of the plate arrangement 11, the flanges 26 will lie by gravity upon the plate 17 which, in this case, is the lower plate.

The lengths of the contact needles can then be such that their tips will no longer project above the plate 15.

When the contact device is so oriented that the tips 41 are turned upwardly, the guide rails 43 can be omitted entirely since the countercontact elements 22 can support the plate arrangement in the direction of the double-headed arrow A for linear movement of the plate arrangement and can effect the requisite centering as will be apparent from FIG. 4.

In the embodiment of FIG. 1, by contrast, the tips 41 at the leading ends of the pins 13 of the contact needles 12 project beyond the front plate 15.

The contact needles 12 are axially movable and guided with slide-bearing play in the bores of the plates 15, 16 and 17 for which each contact needle 12 are received.

Flange 26 of each flanged sleeve 14, in this embodiment, rests by gravity against the intermediate plate 16 in the case in which the plate arrangement 11 is not pressed against a test article 19.

When a test article 29 is pressed against the array of pins or the tips 41 of the device shown in FIG. 1 is pressed against the test article and the countercontact elements 22 are connected to testing circuitry, the test pressure can be applied until the article 29 rests against the front plate 15.

The contact needles 12 are thus pressed upwardly relative to the contact plate arrangement 11 and the flanges 26 are lifted from the plate 16. The plate arrangement 11 is thus held against the plate 20.

The springs 35 are compressed as the contact bodies 32 move into the sleeves 30 since the distance between the test article 29 and the plate 30 is reduced. As a consequence, the spring force applied by the springs 35 to the contact members 32 and hence the spring force applied by the head 33 to the sleeve 14 is increased as is the force applied by the contact needles 12 and their tips 41 to the engaged locations on the test article 29.

The force of each spring 35 appears with practically full amplitude at the point at which each contact needle 12 engages the test article 29 by the tip 41 because the contact needles 12 are practically free from sliding friction against the walls of the bores of the plates 15, 16 and 17 through which the needles pass.

Consequently, a highly reliable electrical contact is ensured between the contact needles 12 and the contact locations engaged by these needles on the respective test article and also a reliable electrical contact between the heads 33 and the flanged sleeves 14 contacted thereby.

As soon as the plate arrangement 11 is reached, its minimum distance from the plate 20 of the holder, the test circuitry can effect the electrical testing of the printed circuit board or other article 29 engaged by the contact elements, the relevant electrical connections being formed through the contact needles and the respective countercontact elements 22 to which the conductors of the test circuit may be connected in the usual manner. The test circuit can apply signals, derive signals, measure electrical parameters or determine local resistances and electrical values.

When the testing device has completed the electrical or electronic testing of the test article 39, the test article 29 is moved away from the contact device 10 and can be replaced by another test article for an identical testing for freedom of the test article from electrical or electronic faults. The system is highly reproducible in the tests it can perform.

In the embodiment of FIG. 1, the plate arrangement 11 is so formed that even upon removal from the holder 19, the contact needles 12 cannot fall out of the plate arrangement since the flanges 26 are held between the two rearmost plates 16 and 17, the two rearmost plates forming stops for the flanges 26.

The flanges 26 thus limit the axial mobility of the contact needles 12 in conjunction with the two rearmost plates 16 and 17.

The plate arrangement 11 can be transported to other locations for other purposes or for use with other holder arrangements 19 or may be used without a holder arrangement altogether. It may be used in different orientations as well because the contact needles cannot fall out of the plate arrangement 11 carrying same.

Figure 3:
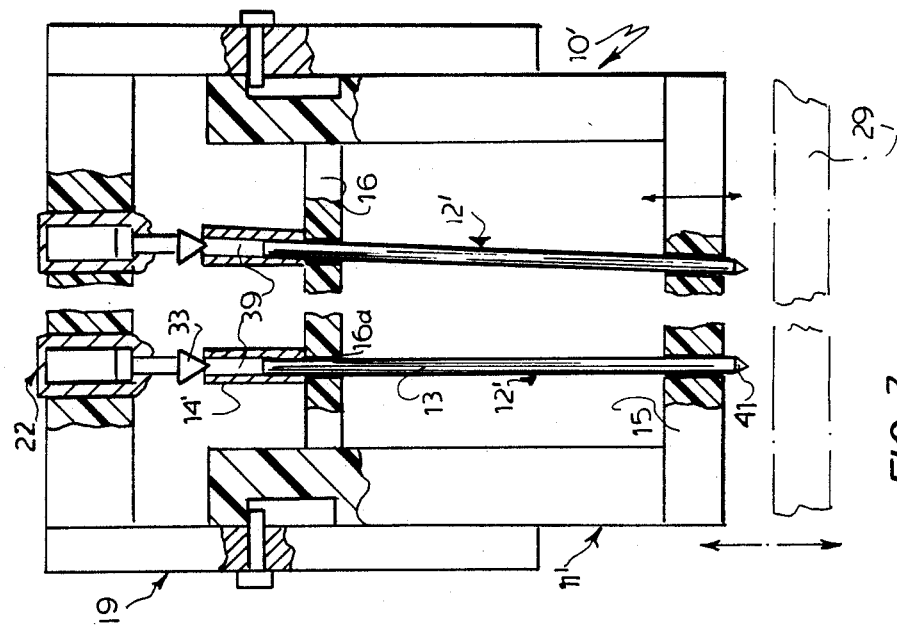
FIG. 3 is a view similar to FIG. 2, but illustrating another embodiment of the invention in which only two plates serve to guide and support the contact needles.

It is also possible, utilizing a similar principle, to provide as in the embodiments of FIGS. 3 and 4, only a single rearward plate 16 to form an abutment for the sleeves 14.

In the case of the contact arrangement 10' of FIG. 3, the sleeve 14' coaxially affixed to the contact pin 13 of the respective contact into 12', is formed only as a circularly cylindrical tube.

The end of the tube 14' turned toward the contact tip 41 forms an abutment against the upper side of the plate 16 since the outer diameter of sleeve 14' is greater than the diameter of the bore 16a through which the contact pin 13 slidably passes.

In the embodiment of FIG. 4, the tubular sleeve 14 is constituted as a flanged sleeve as in the embodiment of FIG. 1 but is reversed on the contact pin 13 by comparison of the orientation of the sleeve of FIG. 1.

Thus the flange 26 of the sleeve 14 in the embodiment of FIG. 4 is provided at the end of the flanged sleeve 14 proximal to the respective countercontact element 22.

In the rest position of the plate arrangement 11, the latter rests upon the flanges 26 which, in turn, rest upon the heads 33 of the countercontact elements 22 and the underside of the plate 16 engages the upper surfaces of the flanges 26.

Each of the plate arrangements 11', 11" of FIGS. 3 and 4, respectively, must be held in position after the contact needles 12' and 12" have been inserted as long as the respective plate arrangement is not held in a corresponding holding device 19 to prevent the contact needles from falling out.

Of course, when it is necessary to transport the respective plate arrangement 11', 11", it is possible to cover the rear plate 16 with an appropriate cover member to prevent falling out of the pins until the arrangement is reinserted in a holder 19.

As soon as the holder 19 is arranged on the respective plate assembly 11, the spring-loaded members 32 of the countercontact elements 22 prevent the contact needles 12' and 12" from falling out as the drawing makes readily apparent.

In the embodiment of FIG. 1, the two rear plates 16 and 17 of the plate arrangement 11 and in the embodiments of FIGS. 3 and 4, the rear plates 16 can have bores which are arranged at the raster or grid points of a predetermined raster or grid. The raster can, for example, be a grid with a spacing between raster points in mutually orthogonal rows of say 1/10th of an inch or some like close-spaced raster.

It is also possible to provide the front plate 15 of the respective plate arrangement with bores traversed by the respective needles which are not disposed in the same pattern as the bores of plates 16 and 17. In this case, the bores of the plates 15 can be positioned to ensure that the contact needles 12 will engage selected locations of the particular type of test article to be evaluated and not necessarily points of the test article which lie exactly in the raster pattern of the bores of the plates 16, for example.

In that case, of course, the bores of the plates 16 and 17 of FIG. 1 and the bores of the plates 16 in FIGS. 3 and 4 must have sufficient slide-bearing play to allow a slight inclination of the contact needles relative to the longitudinal axes of the bores of the plates 15–17.

Only a relatively small play is required since a relatively large offset of the bores of the plates 15 from those of the plates 16 can be accommodated because of the long needle length and the significant distance between these plates.

The needle length can amount to 2 to 12 cm and inclinations of up to 6° from the longitudinal axes of the bores of the plates 16 and 17 can be accommodated.

Of course, it is also possible to offset the bores of one or both of the rearward plates 16 or 17 from the precise raster pattern to effect an inclination of the respective contact needles. Of course, in this case, the respective plates 16 or 17 can be used only for one type of article to be tested and must be replaced when an article of a different type is to be tested.

With plate arrangements 11, 11', 11" as illustrated in FIGS. 1, 3 and 4, it may be advantageous, in accordance with the invention, to provide each rearward plate 16 or 17 having bores in a predetermined raster pattern, with fields having bores at every raster point whether or not each bore is provided with a contact needle so that these plates need not be changed when different articles are to be tested. Needles can be inserted and removed in accordance with contact patterns established by the bores of the front plate or even independently of the bores of the front plate.

The number of bores of the front plate 15 can be such as to accommodate the number of needles actually used to contact locations on the test article and upon equipping each plate arrangement 11 with the contact needles, only the number of contact needles required by the fewer bores of the front plate 15 need be inserted.

The counter contacts 22 in the plate 20 of the holder can also be located in the aforementioned raster pattern with a corresponding spacing. It has been found to be advantageous to provide a countercontact element 22 at each point of the raster independently of whether or not a contact needle is available to engage this countercontact element.

It suffices upon a changing of the type of test article to provide a plate arrangement 11 with a front plate 15 accommodated to the test pattern of needles to engage the new test article, e.g. by properly positioning the needles in the plate arrangement 11. The holder 19 can thus remain unchanged for all types of test articles to be evaluated since only the countercontact elements 22 must be monitored by the test circuit and provided with electrical conductors for that purpose which are engaged by contact needles.

The equipping of the plate arrangement 11 or 11' or 11" of FIGS. 1, 2 and 4 with neeldes can be effected as follows.

The plate arrangement 11, etc. is removed from the respective holder 19. In the case of the FIG. 1 embodiment, the second rear plate 17 is then removed from the beams 24. This is not necessary in the embodiments of FIGS. 3 and 4.

The previously used contact needles 12, 12', 12" are removed and the removed contact needles can either be used for replacement in the plate arrangement or can be supplemented or replaced by other needles.

The original front plate 15 is placed on the front edges of the beams 24 in a horizontal orientation but is not yet connected rigidly with these beams or placed on some other guide or in some other way fixed in position.

Utilizing a motor-driven positioning device (not shown) this plate can be moved horizontally, perpendicular and parallel to a contact plane or parallel to itself, i.e. shifted in any direction in its plane.

The setting device can itself be controlled by a predetermined program via a computer.

Indeed, a computer-controlled robot can be used for inserting the contact needles one after the other vertically through the predetermined bore of the respective back plate 16 and through a corresponding bore in the front plate 15, the latter having been moved in the manner described until the respective bore of the front plate is aligned with the bore of the back plate 16 so that the contact needle 12 can pass axially vertically downwardly, preferably in free fall, into the bore of the front plate.

The contact needles 12, 12', 12" drop into place until their flanges 26 (FIGS. 1 and 4) rest upon the plate 16 (FIGS. 1 and 4) or the sleeve 14' comes to rest upon the plate 16 (FIG. 3).

The plate 16 in each case is horizontally oriented so that its bores are vertical as are the bores of the front plate 15.

Each subsequent needle is then inserted in a similar manner by dropping the needle through the aligned bores of the plates 16 and 15.

When all contact needles have been inserted into the rear plate 16 and front plate 17, the second rear plate 17 is applied in the embodiment of FIG. 1 and the plate 16 is fixed to the beams 24. The plate arrangement 11, 11', 11" can then be inserted into the respective holder. In the embodiment of FIG. 4 where no holder is provided, the plate arrangement 11, provided with the needles, is engaged by the heads 33 of the countercontact elements and the assembly is inverted.

When there is another change in the type of test article to be evaluated, the contact device has the holder again removed therefrom, the plates 17 and 15 dismounted and one or more needles 12 removed and the needle arrangement adjusted in the manner described with, of course, replacement of the front plate 15 as described.

FIG. 2 shows a variant of the head of the countercontact elements 22. In this variant, the head 33 has outwardly projecting sharp-edged, sharpened (ground) longitudinal edges 36 separated by grooves 37 of triangular cross section, the sharp edges like long generatrices of a conical surface which is coaxial to the longitudinal axis of the contact member 32. This ensures especially good electrical contact between the head 33 and the inner edge 40 of the respective sleeve 14 and 14' of the contact needle 12, 12', 12" engaged thereby.

It is possible, if desired, to provide between the plates 15 and 16 of each plate arrangement 11, 11' or 11", additional plates parallel to the plates 15 and 16 to form additional guides for the contact needles 12, etc. and thereby prevent buckling thereof to these needles which are so thin that there is a danger of buckling.

Indeed, it is especially advantageous to have the plate arrangement 11, 11' movable relative to the holder 19 since this permits the projection of the tips 41 of the contact needles 12 beyond the front plate to be held as small as possible and even to be eliminated. This is especially advantageous in the case that inclined contact needles are provided and must be guided with great precision to target points on the test article 19. However, in many cases it may be desirable to have the tips 41 project beyond the front plate 15 to a significant extent and such that the plate arrangement 11 can be mounted immovably on the holder.

The flanges 26 are, of course, abutments limiting relative displacement of the needles and the plate arrangement. I can refer to them herein as abutments or provide other abutments on the sleeves 14 which function correspondingly.

When the contact device of FIG. 1 is modified (in a manner not shown) so that the flanges 26 lie between the plates 16 and 17 with spacing from both of these plates in a rest position of the plate arrangement 11, the flange need not contact either of these plates when the test article is engaged by the needles. In that case, the flanges form abutments which are only functional when the needles are inserted into the plate arrangements in the manner described and need not come into engagement with the plate 16 at all.

The flanges can be eliminated entirely and the sleeves 14 can serve only for the purpose of making electrical contact with the heads 33 when the insertion of the needles into the plate arrangement is carried out so that the sleeves never come to rest upon the plate 16.

I claim:

1. A contact device for electrical or electronic testing of a test article, said device comprising:

a holder;

an array of electrically conductive countercontact elements on said holder, each of said countercontact elements including a tapering contact head biased by a spring force in a direction of taper of each head;

a plate assembly comprising at least two mutually parallel transversely spaced plates including a rear plate located proximal to said holder and a front plate located remote from said holder and juxtaposable with a test article, said plates being formed with arrays of throughgoing bores;

a plurality of contact needles received in said plate assembly, each of said needles passing slidable through one of the bores of each plate and having a front end formed as a contact tip for contacting said article and a rear end engageable by a respective one of said heads, each of contact needles being constituted as a straight pin traversing a respective bore of said front plate and a tubular sleeve receiving an end of the respective pin at said rear end of the respective needle, each sleeve projecting beyond the respective pin and having a hollow opening at an end of the respective sleeve at a contact edge and receiving the respective head, whereby a taper of each head engages the respective contact edge to form an electrical connection between each head and the respective rear end of a respective contact needle, said contact needles being received in the respective bores of said plates so as to enable axial movement of said contact needles in said plates against the spring forces of the respective contact heads.

2. The contact device defined in claim 1 wherein each of said sleeves forms an abutment engageable with said rear plate.

3. The contact device defined in claim 2 wherein each of said sleeves is formed with an annular flange at an end of the respective sleeve turned toward the respective tip and engageable with a surface of said rear plate turned toward said holder, said assembly further comprising another rear plate spaced from the first-mentioned rear plate and interposed between said first-mentioned rear plate and said support, said other rear plate being formed with bores respectively slidably traversed by said rear ends of said contact needles, said flanges being located between said rear plates and being abuttingly engageable with said other rear plate.

4. The contact device defined in claim 3 wherein said rear plates form stops to opposite axial sides of said flanges limiting axial movement of said contact needles.

5. The contact device defined in claim 4 wherein said assembly has only three plates and is formed with means interconnecting said plates fixedly with one another for joint movement relative to said holder.

6. The contact device defined in claim 2 wherein each of said sleeves has an end forming the respective abutment and engageable with a surface of said rear plate turned toward said holder.

7. The contact device defined in claim 6 wherein said assembly has only two plates and is formed with means interconnecting said plates fixedly with one another for joint movement relative to said holder, said assembly being positioned so that said countercontact elements retain said contact needles in said assembly against falling out in a direction opposite to that in which said sleeves abut said surface of said rear plate turned toward said holder.

8. The contact device defined in claim 2 wherein said sleeves traverse said bores of said rear plate and each sleeve is formed with an annular flange at an end of the respective sleeve turned toward the respective countercontact element and abuttable against a surface of said rear plate turned toward said holder.

9. The contact device defined in claim 8 wherein said assembly has only two plates and is formed with means interconnecting said plates fixedly with one another for joint movement relative to said holder, said assembly being positioned so that said countercontact elements retain said contact needles in said assembly against falling out in a direction opposite to that in which said sleeves abut said surface of said rear plate turned toward said holder.

10. The contact device defined in claim 1 wherein each of said heads is formed with a plurality of sharp outer edges lying along generatrices of a conical surface and engageable with the respective edges.

11. The contact device defined in claim 1 wherein each of said countercontact elements includes a spring-loaded pin formed with the respective head.

12. The contact device defined in claim 1 wherein each of said sleeves is welded to the respective pin of the respective contact needle.

13. The contact device defined in claim 2 wherein each of said sleeves is formed with an enlargement forming the respective abutment at an end of the respective sleeve turned toward the respective tip.

14. The contact device defined in claim 1, further comprising guide means for guiding said assembly for linear movement relative to said holder, and spring means between said holder and said assembly biasing said assembly away from said array of countercontact elements.

15. The contact device defined in claim 1 wherein said bores of said front plate are laid out to correspond to locations on said article to be engaged by said tips, and the bores of said rear plate are laid out in accordance with a fixed-spacing raster.

16. The contact device defined in claim 1 wherein said contact needles are constituted as axially rigid elements during operation of the device.

17. A method of introducing contact needles into a plate assembly of a contact device for electrical or electronic testing of a test article, said device comprising:
 a holder;
 an array of electrically conductive countercontact elements on said holder, each of said countercontact elements including a tapering contact head biased by a spring force in a direction of taper of each head;
 a plate assembly comprising at least two mutually parallel transversely spaced plates including a rear plate located proximal to said holder and a front plate located remote from said holder and juxtaposable with a test article, said plates being formed with arrays of throughgoing bores;
 a plurality of contact needles received in said plate assembly, each of said needles passing slidable through one of the bores of each plate and having a front end formed as a contact tip for contacting said article and a rear end engageable by a respective one of said heads, each of contact needles being constituted as a straight pin traversing a respective bore of said front plate and a tubular sleeve receiving an end of the respective pin at said rear end of the respective needle, each sleeve projecting beyond the respective pin and having a hollow opening at an end of the respective sleeve at a contact edge and receiving the respective head, whereby a taper of each head engages the respective contact edge to form an electrical connection between each head and the respective rear end of a respective contact needle, said contact needles being received in the respective bores of said plates so as to enable axial movement of said contact needles in said plates against the spring forces of the respective contact heads,
 said method comprising the steps of:
 (a) positioning said rear plate above said front plate while enabling relative displacement of said plates;
 (b) relatively displacing said plates to position a selected bore of said front plate directly below a selected bore of said rear plate;
 (c) dropping a respective needle through said bores from above;
 (d) repeating steps (b) and (c) in succession of all of the needles required to engage and test said article; and
 (e) fixing said plates against relative displacement, whereby at least some of the bores of said front plate are offset from locations directly below the corresponding bores of said rear plate and the respective contact needles are thereby inclined to the axes of respective bores of said rear plate.

18. The method defined in claim 17, further comprising the step of applying another rear plate to said assembly following step (d) so as to receive each of said sleeves in a respective bore of said other plate.

* * * * *